(12) United States Patent
Sinoussi

(10) Patent No.: US 8,816,790 B2
(45) Date of Patent: Aug. 26, 2014

(54) SELF-BIASED AMPLITUDE-CONTROLLED OSCILLATOR WITH CONSTANT HARMONIC CONTENT

(76) Inventor: Nabil Mohamed Sinoussi, Cairo (EG)

(*) Notice: Subject to any disclaimer, the term of this patent is extended or adjusted under 35 U.S.C. 154(b) by 66 days.

(21) Appl. No.: 13/539,719

(22) Filed: Jul. 2, 2012

(65) Prior Publication Data
US 2013/0271226 A1   Oct. 17, 2013

Related U.S. Application Data

(60) Provisional application No. 61/503,979, filed on Jul. 1, 2011.

(51) Int. Cl.
*H03L 7/099*   (2006.01)

(52) U.S. Cl.
USPC ...... 331/185; 331/167; 331/158; 331/116 FE; 331/116 R

(58) Field of Classification Search
USPC ........... 331/158, 175, 183, 176, 16 R, 116 FE
See application file for complete search history.

(56) References Cited

U.S. PATENT DOCUMENTS 6,798,308 B2 *   9/2004   Sanduleanu et al. .......... 331/175
7,961,060 B1 *   6/2011   McMenamy et al. ......... 331/186

* cited by examiner

*Primary Examiner* — Arnold Kinkead
(74) *Attorney, Agent, or Firm* — Useful Arts IP

(57) ABSTRACT

Oscillators are described that have a highly stable output frequency versus the variation of supply voltage and different operating conditions such as temperature. The concepts are broadly applicable to various types of oscillators. The highly stable output is achieved with the use of self biasing loops. The circuits associated with providing constant harmonic output current can be used with the concept of a phi-null oscillator to further stabilize the output frequency.

34 Claims, 18 Drawing Sheets

SELF-BIASED AMPLITUDE-CONTROLLED OSCILLATOR WITH CONSTANT HARMONIC CONTENT

FIELD OF THE INVENTION

The present invention generally relates to oscillators that provide a highly stable output frequency versus the variation of different operating conditions such as temperature, humidity stress aging and supply voltage.

BACKGROUND OF THE INVENTION

Oscillators are inherently non-linear circuits. FIG. 1 shows a basic oscillator 5. A passive lossy resonator 10 acts as the frequency selective element. $R_p$ 20 represents the resonator losses. The Gm cell 30 is an active transconductance. The fixed bias voltage $V_b$ sets the operating bias point of the active device and in turn the value of the transconductance Gm. The Gm cell 30 is connected in a positive feedback configuration and is used to provide a negative resistance (−1/Gm) that will cancel out Rp 20. When the product Gm·Rp is exactly equal to 1, the oscillation sustains. From a pure practical point of view, Gm must exceed 1/Rp for the oscillation to start. As the oscillation amplitude grows, Gm decreases due to the non-linear nature of the active transconductor. The oscillation settles when Gm·Rp=1 for the fundamental frequency component. At this point, the output current of the active Gm cell 30 injected into the resonator 10 has an appreciable amount of harmonics. These harmonics cause energy imbalance between the capacitor and the inductor and thus lower the oscillation frequency to restore balance as given in Equation 1:

$$f = f_0\left(1 - \frac{1}{2Q^2}\sum_{2}^{\infty}\frac{n^2}{n^2-1}\left(\frac{I_n}{I_1}\right)^2\right)$$ Equation 1

In Equation 1, $f_o$ is the oscillation frequency without harmonics and Q is the intrinsic quality factor of the resonator. "I" denotes the current signal injected into the resonator where $I_n$ is the amplitude of the $n^{th}$ harmonic of the current signal and $I_1$ is the amplitude of the fundamental harmonic.

The level of current harmonics ($I_n/I_1$) injected by the Gm cell 30 depends mainly upon the oscillation amplitude referred to the operating bias point of the active Gm cell. Since both, the amplitude and the operating bias point, exhibit a lot of variation versus electrical, physical and environmental conditions (together referred to as "operating conditions"), the harmonic level of the oscillator also varies, and thus the oscillation frequency f varies. This variation degrades the performance of clock reference oscillators with regard to the output frequency stability.

Traditionally, high performance clock reference oscillators have minimized the impact of harmonics on the oscillation frequency by decreasing the level of harmonics. This has been done by utilizing an automatic amplitude control (AAC) circuit (also called amplitude regulator circuit). The AAC is basically a feedback bias loop which sets the oscillation amplitude at an appropriate level and achieves the condition Gm·Rp=1 without driving the active Gm cell into a highly non-linear state.

FIG. 2 shows an oscillator circuit 100 containing an automatic amplitude control (AAC) circuit 110. Instead of having a fixed bias, the Gm cell bias Vb is controlled by the AAC 110. The AAC 110 comprises a peak detector 111 and a bias cell 112. The peak detector circuit 111 senses the AC (Alternating Current) oscillation signal Vo at the input and rectifies it into a DC (Direct Current) average signal VDC that is proportional to the oscillation amplitude Ao. According to the value of VDC, the bias cell circuit 112 generates a bias voltage Vb for the active Gm cell 30. The AAC modulates the transconductance Gm through Vb until the oscillation amplitude (Ao) settles at its target steady state value. The steady state solution of the circuit depends upon the characteristics of both the AAC 110 and the oscillator 5. Normally, the characteristics of both the oscillator 5 and the AAC 110 are adjusted such that the active Gm cell settles at a transconductance that is slightly higher than the critical oscillation condition Gm·Rp=1. For decades, this technique has been adopted in the design of high performance crystal oscillators (XOs) for two main reasons: (1) decreasing the current consumption of the oscillator and (2) decreasing the impact of harmonics on frequency stability. However, this technique does not offer good control over the absolute value of the oscillation amplitude.

In order to be able to precisely define the steady state oscillation amplitude, a modified AAC circuit has been utilized. FIG. 3 shows a schematic diagram of an oscillator circuit 200 whose amplitude is controlled by the modified AAC 210. The new AAC 210 comprises a peak detector block 111, an error amplifier 212 and a reference voltage VREF. The peak detector performs the same functionality that has been stated earlier. The error amplifier (EA) 212 compares VDC to VREF and generates the bias voltage Vb according to the error (VREF-VDC). The AAC 210 changes Vb and in turn Gm bias point until the oscillation amplitude (Ao) reaches a specific value that makes VDC equal to VREF. Hence, for a given value of VREF, the AAC 210 sets the appropriate operating bias point of the active Gm cell 30 so as to precisely achieve the oscillation amplitude (Ao) that corresponds to this specific value of VREF. FIG. 6, like FIG. 3, shows an AAC controlled oscillator 400. In FIG. 6, the oscillator is a CMOS LC oscillator.

The AAC circuit 210 has been used in oscillators for purposes other than frequency stability. For example, it is often used in inductor-capacitor (LC) voltage-controlled oscillators (VCO's) to maintain a constant output amplitude for the subsequent circuits and to optimally bias the VCO across the different operation conditions. In U.S. Pat. No. 7,659,788, a self-biased amplitude regulated LC VCO has been introduced; the aim was to optimize the VCO current consumption and to stabilize the oscillation amplitude versus the different operation conditions rather than stabilizing the output frequency which is not of interest in LC VCO's.

BRIEF DESCRIPTION OF THE DRAWING FIGURES

The present invention may be further understood from the following description in conjunction with the appended drawings. In the drawings:

FIG. 1 is a diagram of a basic oscillator.
FIG. 2 is a diagram of a basic amplitude controlled oscillator.
FIG. 3 is a diagram of a basic oscillator with an AAC precisely defining its oscillation amplitude according to a reference voltage $V_{REF}$.
FIG. 4 is a conceptual diagram of a self-biased amplitude controlled oscillator.
FIG. 5 is a diagram of CMOS LC oscillator.
FIG. 6 is a diagram of an AAC controlled CMOS LC oscillator with constant reference voltage $V_{REF}$.

DETAILED DESCRIPTION

Summary

Figure 1:
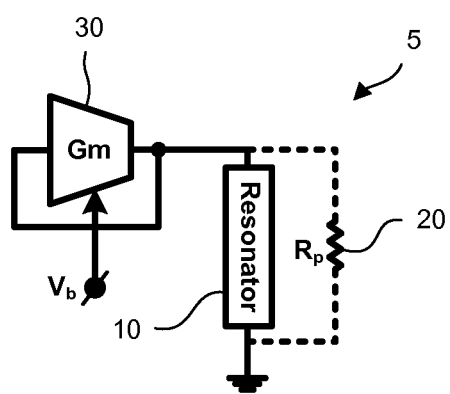
Figure 2:
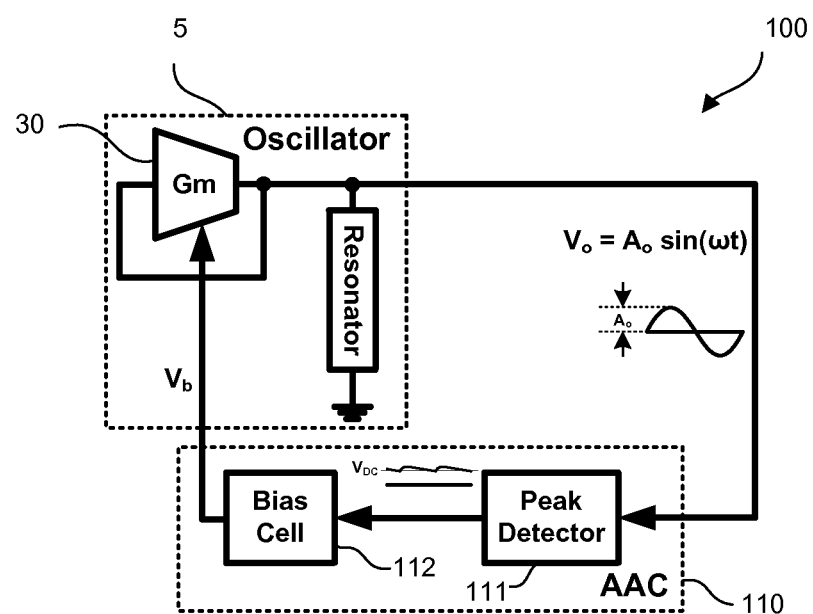

An objective is to minimize the impact of harmonics on the stability of the output frequency of oscillators. The present inventors have found that even at relatively low and constant oscillation amplitudes achieved in AAC controlled oscillators, the harmonic content has an appreciable impact on the stability of the output frequency of the AAC controlled oscillators. The present inventors have further found that the problem lies in the variation of the operating bias point of the active Gm cell across the different operating conditions. Thus, the harmonic content varies, and in turn the output frequency varies.

In this description, an oscillator with stable harmonic content under varying operating conditions is described. In one embodiment, this is accomplished by forcing the oscillation amplitude to track the operating bias point of an active transconductance (Gm) cell. As a result, the impact of the harmonic content on the oscillation frequency is substantially eliminated. In the case of a basic oscillator circuit 200 with an AAC 210 (Automatic Amplitude Control), the AAC reference voltage $V_{REF}$ should track a parameter in the operating bias point to achieve constant harmonic content, creating a bias loop. Hence the AAC and the oscillator may be made self-biased in order to achieve a constant harmonic content.

Depending on the type of active devices used in the Gm cell, different parameters may need to be tracked to achieve constant harmonic content. For example, the parameter to be tracked may be voltage, current, power, resistance or some other quantity.

Further, the operating bias point of the active Gm cell of the oscillator may always be replicated in a Gm cell replica block, provided that the oscillator active Gm cell and the Gm bias replica block are exposed to the same operating conditions. Thus, the oscillation amplitude keeps tracking the operating bias point of the active Gm cell such that the harmonic content remains constant. This tracking between the oscillation amplitude and the operating bias point of the active Gm cell stabilizes the harmonic content versus the variations of the different operating conditions such as but not limited to supply voltage, temperature, humidity, stress and aging.

The present techniques are applicable to any kind of oscillators whatever the type of resonator used such as but not limited to Quartz Crystal resonators (XTALs), ceramic resonators, Micro Electro-Mechanical Systems (MEMS) resonators, Surface Acoustic Wave (SAW) resonators, Bulk Acoustic Wave (BAW) resonators, inductor-capacitor electrical resonator and integrated inductor-capacitor electrical resonator. Moreover, the present techniques are applicable whatever the type of active circuitry used in the oscillator such as but not limited to Metal Oxide Semiconductor Field Effect Transistors (MOSFET), Bipolar Junction Transistors (BJT), Metal Semiconductor Field Effect Transistors (MESFET), Junction Field Transistors (JFET) and a mixture of different types of such devices. Furthermore, the active circuitry and the resonator can be integrated on any type of technology such as but not limited to Complementary Metal Oxide Semiconductor (CMOS) technology, bipolar technology, Bipolar-CMOS (Bi-CMOS) technology, Silicon Germanium (SiGe) technology, Silicon Carbide (SiC) technology, Silicon-On-Insulator (SOI) technology and Micro-Electro-Mechanical Systems (MEMS) technology.

In one embodiment, a method of reducing or minimizing variations in harmonic content of current applied to a resonator of an oscillator circuit including an amplifier and a resonator coupled in a closed loop includes: producing a bias signal for the amplifier by performing automatic amplitude control of the output signal using a time-varying amplitude reference signal; and deriving the time-varying amplitude reference signal from the bias signal using a replica circuit that replicates at least one property of the amplifier circuit. The time-varying amplitude reference signal may be derived so as to enhance the stability of an output frequency of the oscillator circuit. Methods further include operating the oscillator circuit within a region of a local or global temperature null, in which region the frequency of the output signal exhibits a reduced sensitivity to changes in temperature.

In accordance with another embodiment, an oscillator circuit includes an amplifier and a resonator coupled in a closed loop and further includes: automatic amplitude control circuitry for producing a bias signal for the amplifier by performing automatic amplitude control of an output signal of the amplifier using a time-varying amplitude reference signal; and replica circuitry that replicates at least one property of the amplifier circuit for deriving the time-varying amplitude reference signal from the bias signal. The replica circuit may be configured to derive the time-varying amplitude reference signal so to reduce or minimize variations in harmonic content of a current applied to the resonator versus the different operating conditions. Alternatively, the replica circuit may be configured to derive the time-varying amplitude reference signal so as to enhance the stability of an output frequency of the output signal of an oscillator circuit. The amplifier may be a differential MOS amplifier, and the property may be an overdrive voltage by which a gate voltage applied to a MOS transistor of the amplifier exceeds a threshold voltage of that transistor. The amplifier may be a differential bipolar amplifier, and the property may be the thermal voltage of a bipolar transistor of the amplifier. Circuitry may be provided for operating the oscillator circuit within a region of a local or global temperature null, in which region the frequency of the output signal exhibits a reduced sensitivity to changes in temperature.

DESCRIPTION

Figure 3:
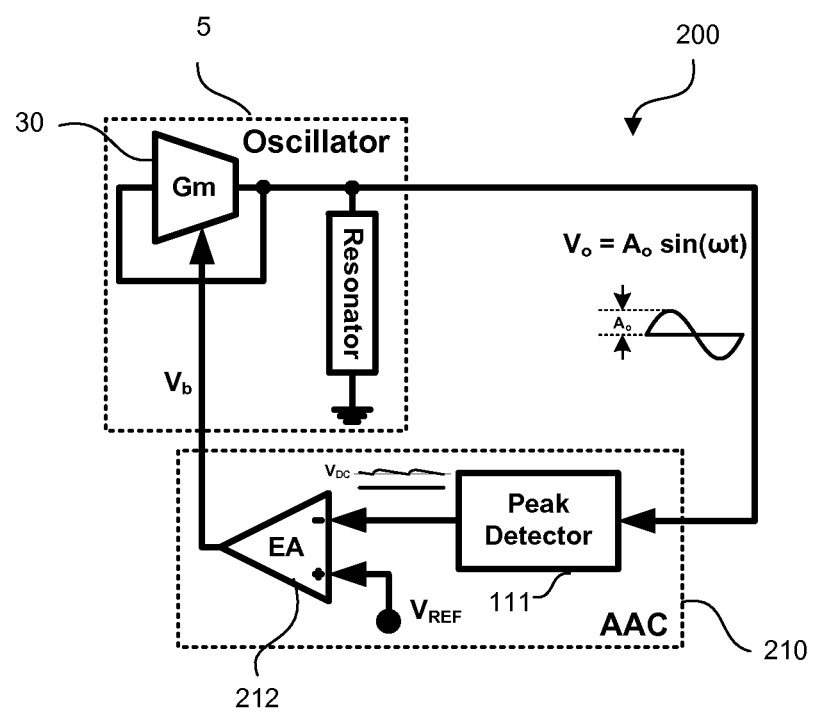

As described herein, oscillator frequency stability is increased by stabilizing the harmonic content by forcing the oscillation amplitude to track the operating bias point of the Gm cell. In order to achieve this condition, $V_{REF}$ in FIG. 3 must track the operating bias point of the active Gm cell 30. Since the operating bias point is actually defined by $V_{REF}$, a bias loop is created. In other words, in one aspect, the AAC and the oscillator have to be self-biased in order to achieve constant harmonic content.

Figure 4:
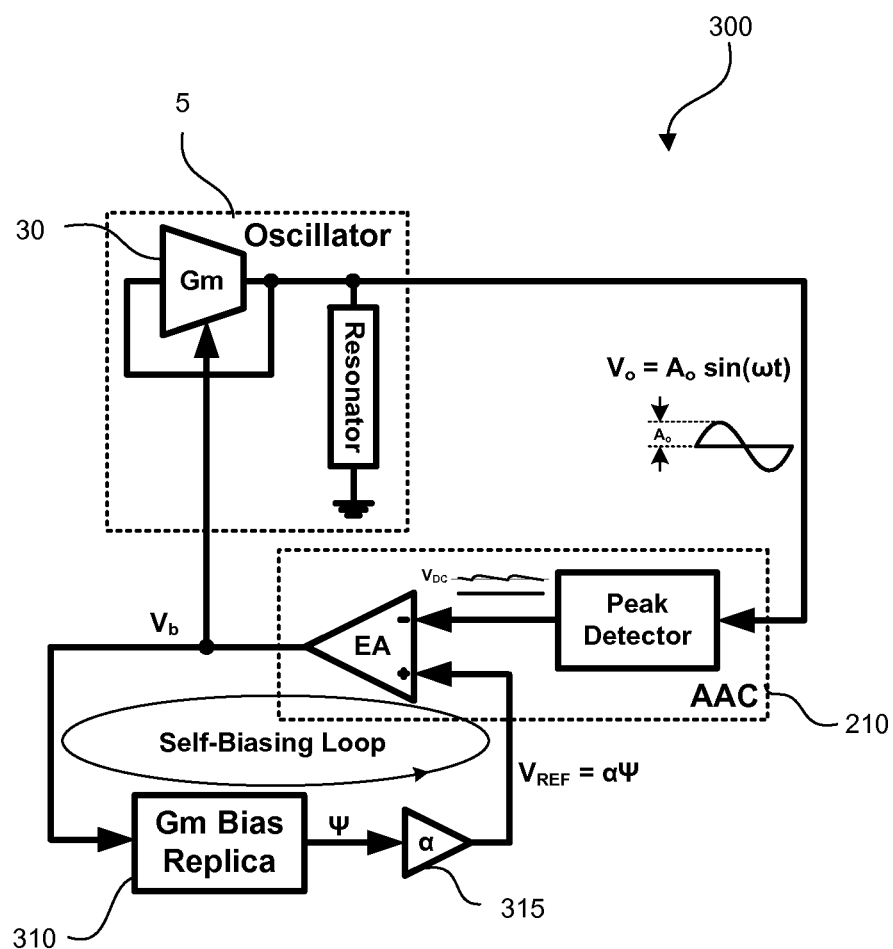

FIG. 4 illustrates a first embodiment. The apparatus comprises two extra blocks, which are the Gm bias replica block 310 and the signal conditioning block "α" 315. The Gm bias replica block 310 takes the Gm bias voltage $V_b$ as an input and replicates the operating bias point of the Gm cell 30 so as to generate one of the Gm cell operating point parameters "ψ". ψ is the electrical operating point parameter of the Gm cell 30 that should be tracked by the oscillation amplitude to stabilize the harmonic content. ψ can be any electrical parameter whether voltage, current, power, resistance, transconductance, etc; the particular parameter depends upon the type of the active devices used in the Gm cell. After generating ψ, it is multiplied by a conditioning factor "α" produced by the signal conditioning block 315, to generate the AAC reference voltage $V_{REF}$. For example, if ψ is a current operating point parameter, then α is a transimpedance amplifier, and if ψ is a voltage operating point parameter, then α is just a scaling factor.

The operating bias point of the active Gm cell 30 of the oscillator may be replicated in the Gm cell replica block 310 provided that the oscillator active Gm cell 30 and the Gm bias replica 310 are exposed to the same operating conditions. If so, then the oscillation amplitude keeps tracking the operating bias point of the active Gm cell 30 such that the harmonic content remains constant. By virtue of this tracking between the oscillation amplitude and the operating bias point of the active Gm cell 30, the described arrangement stabilizes the harmonic content versus the variations of the different operating conditions such as but not limited to supply voltage, temperature, humidity, stress and aging ("operating conditions").

Note in FIG. 4 that a bias signal $V_b$ is produced for the active Gm cell 30 by performing automatic amplitude control (AAC 210) of the oscillator 5 output signal using a time-varying amplitude reference signal $V_{REF}$; and deriving the time-varying amplitude reference signal $V_{REF}$ from the bias signal $V_b$ using a replica circuit 310 that replicates at least one property of the active Gm cell 30.

The techniques illustrated in FIG. 4 are applicable to any kind of oscillators whatever the type of resonator used such as but not limited to Quartz Crystal resonators (XTALs), ceramic resonators, Micro Electro-Mechanical Systems (MEMS) resonators, Surface Acoustic Wave (SAW) resonators, Bulk Acoustic Wave (BAW) resonators, inductor-capacitor electrical resonator and integrated inductor-capacitor electrical resonator. Moreover, the techniques are applicable whatever the type of active circuitry used in the oscillator such as but not limited to Metal Oxide Semiconductor Field Effect Transistors (MOSFET), Bipolar Junction Transistors (BJT), Metal Semiconductor Field Effect Transistors (MESFET), Junction Field Transistors (JFET) and a mixture of different types of such devices. Furthermore, the active circuitry and the resonator can be integrated on any type of technology such as but not limited to Complementary Metal Oxide Semiconductor (CMOS) technology, bipolar technology, Bipolar-CMOS (Bi-CMOS) technology, Silicon Germanium (SiGe) technology, Silicon Carbide (SiC) technology, Silicon-On-Insulator (SOI) technology and Micro-Electro-Mechanical Systems (MEMS) technology.

Figure 5:
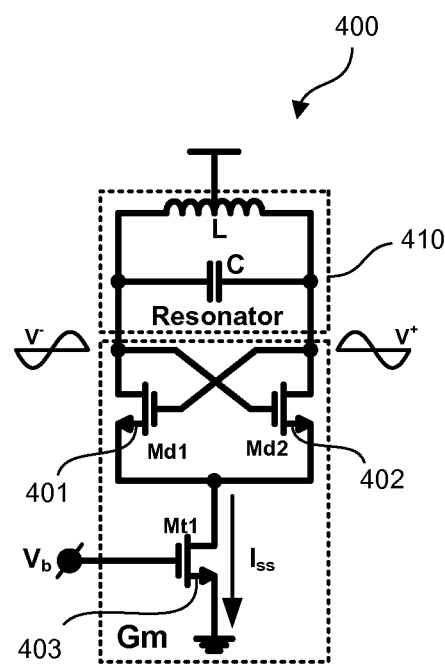

A specific example using a CMOS LC oscillator is now described. FIG. 5 shows a standard CMOS LC oscillator. Compared to FIG. 1, the Gm cell 30 is realized by an CMOS differential pair Md1 401 and Md2 402 and their tail current source Mt1 403. Meanwhile, the LC tank 410 acts as the resonator 10. The bias voltage $V_b$ at the gate of Mt1 403 acts as the tuning knob that will control the transconductance by changing the tail current $I_{SS}$.

The harmonic levels in the current output of a CMOS differential pair may be calculated using the large signal response of the CMOS differential pair.

Figure 7:
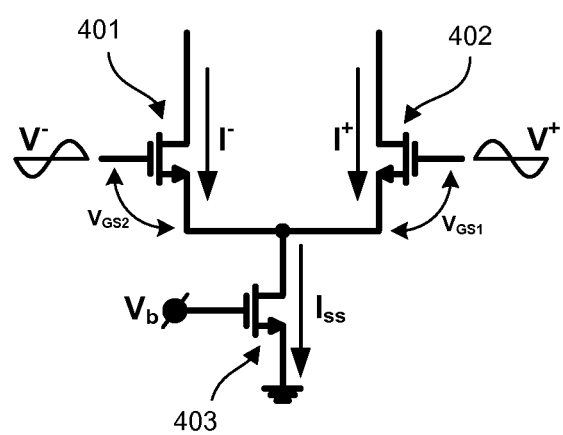
FIG. 7 is a diagram of CMOS differential pair under differential excitation.

In order to understand the operating bias point of the CMOS differential pair, as shown in greater detail in FIG. 7, assume only a common mode input bias at the gates of the differential pair 401 and 402. Thus, at the operating bias point, the voltages denoted on FIG. 7 are given as:

$$V^+ = V^-$$ Equation 2

$$V_{GS1} = V_{GS2} = V_{eff} + V_{TH}$$ Equation 3

In Equation 3, $V_{eff}$ is the differential pair overdrive voltage at the operating bias point, $V_{eff} = V_{GS} - V_{TH}$, and $V_{TH}$ is the device threshold voltage.

Under the same operating bias point conditions, the devices currents are given as:

$$I^+ = I^- = \frac{I_{SS}}{2} = \frac{1}{2}\mu C_{OX} \frac{W}{L}(V_{eff})^2$$ Equation 4

In Equation 4, μ is the electron mobility, $C_{ox}$ is the CMOS oxide capacitance per unit area, W is the CMOS device channel width and L is the CMOS device channel length.

Therefore, the overdrive voltage of the differential pair at the operating bias point is given as:

$$(V_{eff})^2 = \frac{I_{SS}}{\mu C_{OX} \frac{W}{L}}$$ Equation 5

Now, assume that the differential pair 401 and 402 of FIG. 7 is differentially stimulated by a signal $V_d$. The differential output current $I_d$ can be given by the relations:

$$V_d = V^+ - V^-$$ Equation 6

$$I_d = I^+ - I^-$$ Equation 7

$$I_d = \frac{1}{2}\mu C_{OX} \frac{W}{L} V_d \sqrt{\frac{4I_{SS}}{\mu C_{OX} \frac{W}{L}} - V_d^2}$$ Equation 8

Using the previous definition of $V_{eff}$, the differential output current $I_d$ is given in terms of $V_{eff}$ as follows:

$$I_d = I_{SS}\left(\frac{V_d}{V_{eff}}\right)\sqrt{1 - \frac{1}{4}\left(\frac{V_d}{V_{eff}}\right)^2}$$ Equation 9

Figure 8:
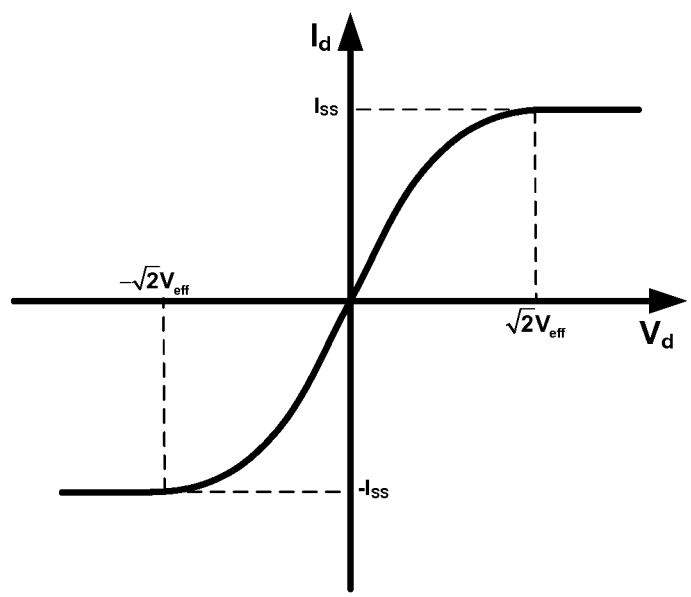
FIG. 8 is a diagram showing I-V characteristics of a CMOS differential pair.

This relation is valid under the condition that: $I_d < I_{SS}$. Beyond this point the whole current of the tail source swings in one device while the other device is totally switched off with zero current. This point occurs when $V_d = \sqrt{2}V_{eff}$. FIG. 8 shows a plot for $I_d$ versus $V_d$.

Assuming that an AC differential signal of angular frequency ($\omega_x$) and amplitude $A_o$ is applied to the differential pair, and neglecting the high frequency effects, the output differential current is given by:

$$I_d(t) = I_{SS}\left(\frac{A_0}{V_{eff}}\sin(\omega_x t)\right)\sqrt{1 - \frac{1}{4}\left(\frac{A_0}{V_{eff}}\sin(\omega_x t)\right)^2} \qquad \text{Equation 10}$$

As may be seen, $I_d(t)$ is not a pure sinusoidal waveform; rather, it contains the harmonics of $\omega_x$. In order to define these harmonics exactly, one has to solve the Fourier Series for $I_d(t)$. However, by inspecting the equation, one realizes that all the harmonic levels depend solely upon the factor $A_o/V_{eff}$. This means that if an apparatus succeeds in stabilizing the ratio $A_o/V_{eff}$ versus the variation of the different operating conditions, the current harmonic content remains constant provided that $A_o$ does not exceed $\sqrt{2}V_{eff}$. Otherwise, the relation is not valid.

From this analysis, it may be appreciated that $V_{eff}$ is equivalent to $\psi$, described above, and that $\alpha$ is just a scaling factor. In other words, if the active Gm cell of an oscillator is a CMOS differential pair such as 401 and 402, then $V_{eff}$ is the operating point parameter that should be tracked by the oscillation amplitude to obtain a constant harmonic content. Thus, the Gm bias replica 310 can be a circuit that replicates the overdrive voltage ($V_{eff}$) of the CMOS differential pair.

Figure 9:
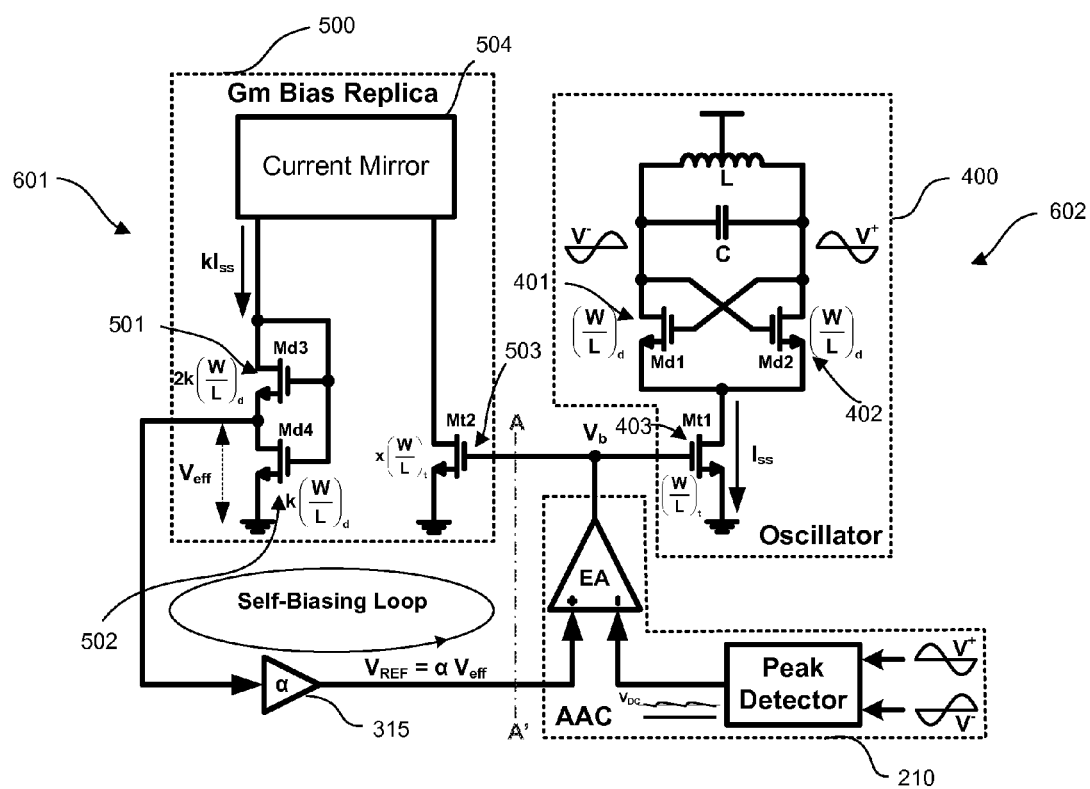
FIG. 9 is a diagram of a self-Biased CMOS oscillator employing $V_{eff}$ referred reference voltage for the AAC.

One circuit implementation of the self-biased CMOS LC oscillator with constant harmonic content will now be described in relation to FIG. 9. The Gm bias replica 500 or $V_{eff}$ tracking circuit is realized by the transistors Mt2 503, Md3 501 and Md4 502, and the current mirror 504. The current mirror ratios and the sizing of Mt2 503, Md3 501 and Md4 502 are adjusted with reference to Mt1 403, Md1 401 and Md2 402 so as to generate the overdrive voltage of Md1,2 ($V_{eff}$) on the drain of Md4 502 which is operating in triode mode. The gain block "$\alpha$" 315 is just a scaling amplifier.

Figure 10A:
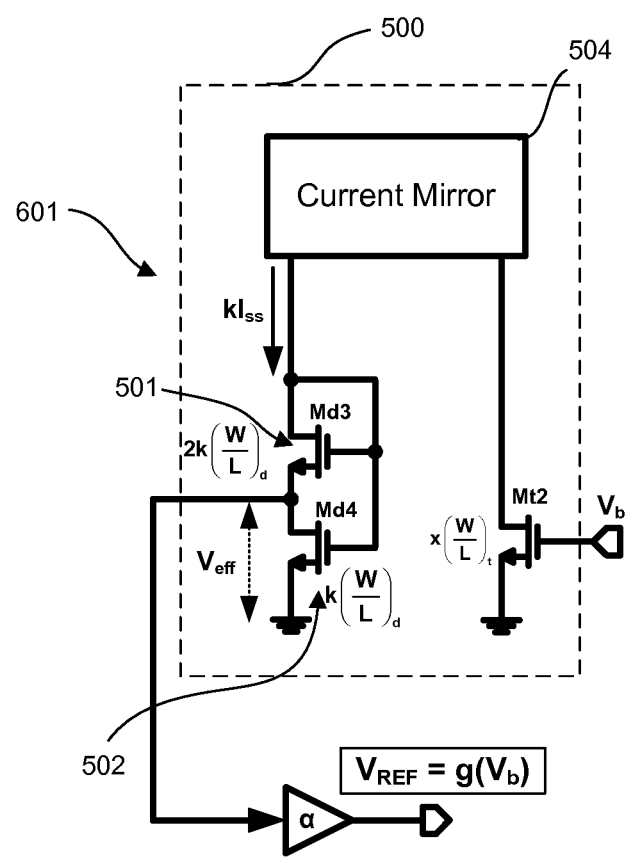
FIG. 10A is a diagram of a $V_{eff}$ tracking circuit.
Figure 10B:
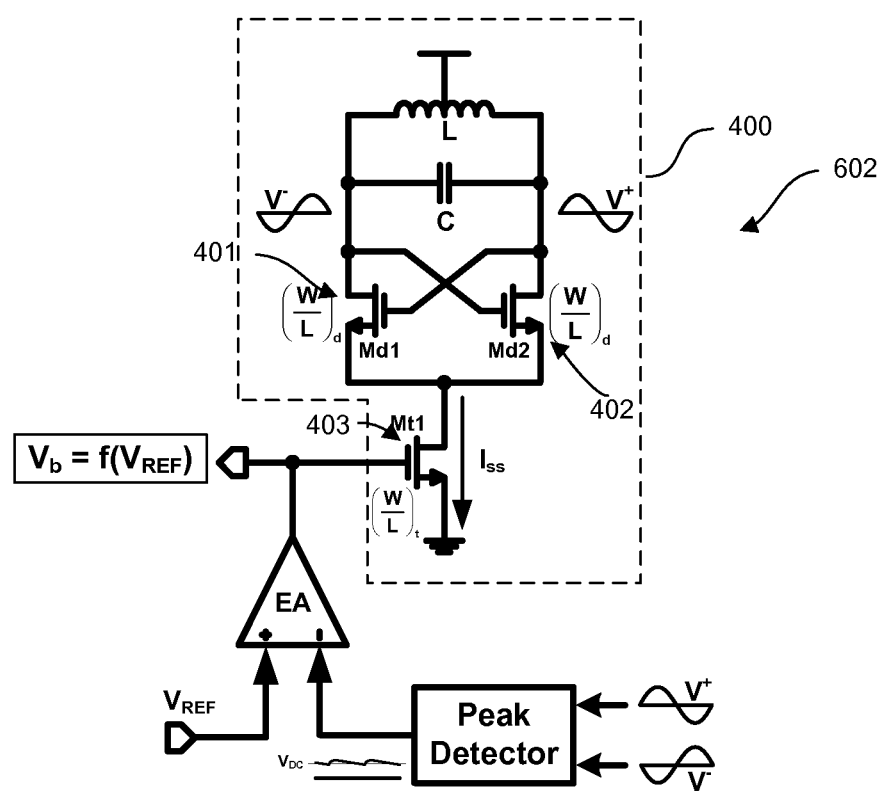
FIG. 10B is a diagram of an AAC controlled CMOS oscillator.
Figure 10C:
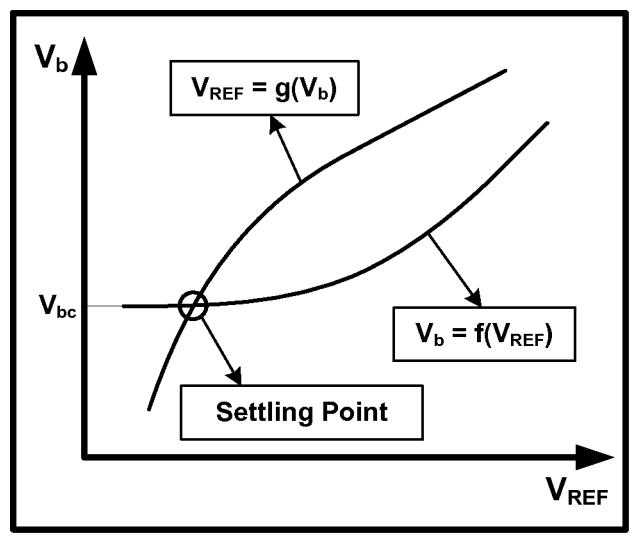
FIG. 10C is a diagram showing a self-biased oscillator settling point.

In order to define the oscillator settling conditions, the self biasing loop may be analyzed as follows. The loop is split along the axis AA' as denoted on FIG. 9. The left half is denoted as 601 and the right half is denoted by 602. The two halves 601 and 602 of the circuit are shown in FIG. 10A and FIG. 10B. Each half has a DC transfer characteristic. FIG. 10A shows the first half 601 which is the $V_{eff}$ tracking circuit and from which $V_{REF}$ is expressed as a function of $V_b$: $V_{REF}=g(V_b)$. FIG. 10B shows the second half 602 which is the AAC controlled oscillator from which the DC function of $V_b$ versus $V_{REF}$ is extracted: $V_b=f(V_{REF})$. This self biasing loop settles at a point where $V_b$ and $V_{REF}$ simultaneously satisfy the two functions $g(V_b)$ and $f(V_{REF})$ as shown in FIG. 10C.

There is another possible operating point which is probably outside the circuits dynamic range due to the slowly varying function $V_b=f(V_{REF})$. Finally, the voltage $V_{bc}$ denoted in FIG. 10C is the critical bias voltage below which the circuit cannot oscillate because the CMOS transconductance is then less than the critical oscillation condition: Gm·Rp=1.

Figure 6:
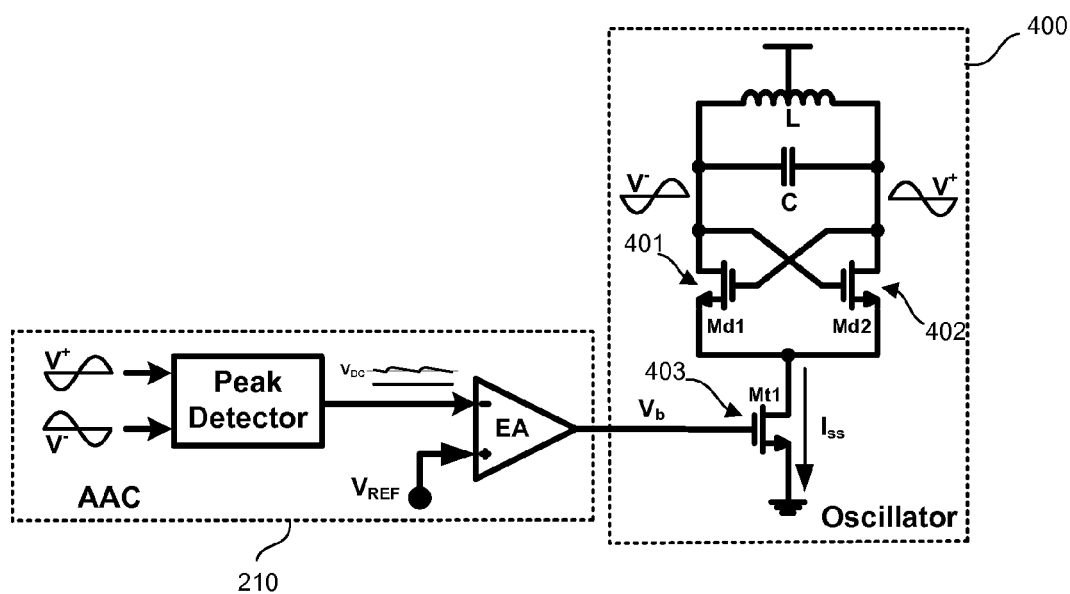
Figure 11:
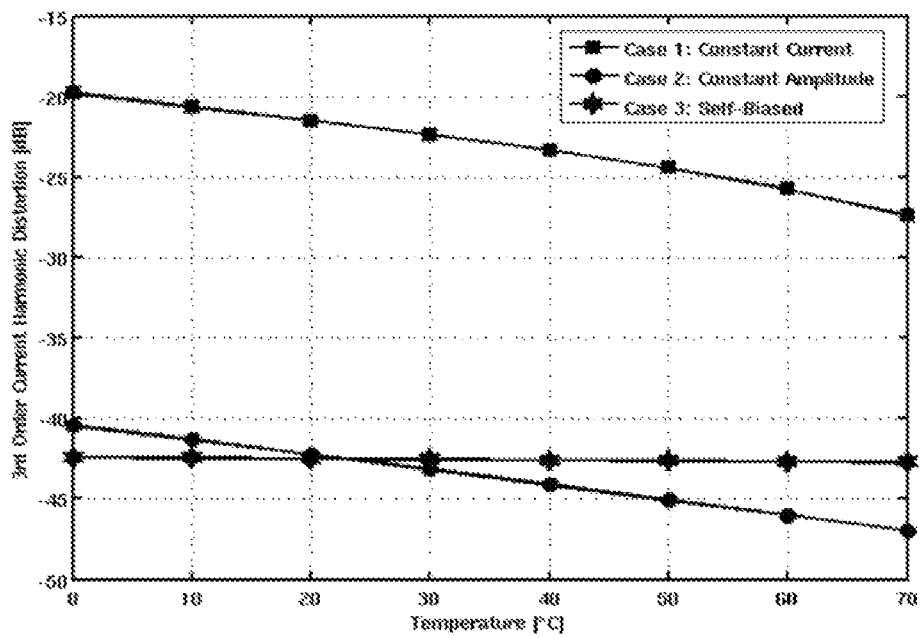
FIG. 11 is a diagram illustrating performance of a self-biased oscillator with regards to the current harmonic content.

The harmonic content of a CMOS LC oscillator may be examined across temperature using three different biasing techniques: (1) constant current bias (FIG. 5), (2) constant oscillation amplitude using an AAC and a constant reference voltage $V_{REF}$ (FIGS. 6), and (3) self-biased using Veff tracking (FIG. 9). The monitored variable is the $3^{rd}$ order harmonic distortion of the differential current signal flowing inside the tank circuit. FIG. 11 shows the results. Techniques (1) and (2) exhibit at least 6 dB of variation across the temperature range from 0-70° C. Meanwhile, technique (3) substantially stabilizes the harmonic content across temperature with less than 0.5 dB of variation.

Note that the harmonic content of the oscillator is stabilized by genuinely tracking the operating bias point of the active circuitry which is the major source of harmonics, rather than applying some sort of compensation. The methodology of tracking guarantees that the oscillator sustains the stability of the harmonic content not only versus the variation of temperature, but also versus the variations of any other operating condition such as but not limited to supply voltage, humidity, stress and aging.

Figure 12:
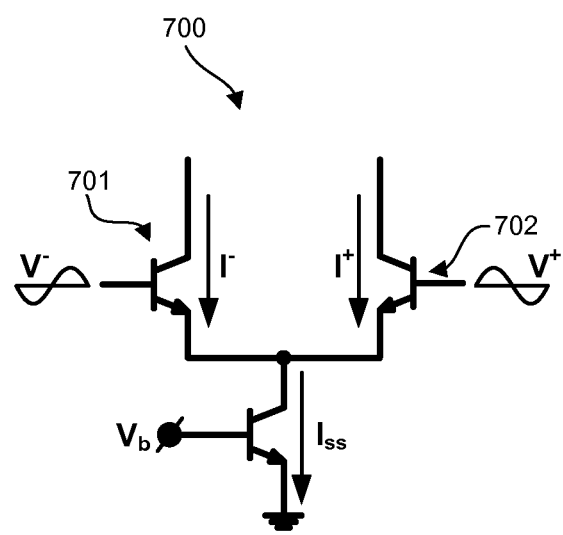
FIG. 12 is a diagram of a BJT differential pair under differential excitation.

The circuit implementation of a BJT Differential pair oscillator with constant harmonic content is now described. Assume that the differential BJT pair 701 and 702 in FIG. 12 is stimulated by a differential signal $V_d$. The differential output current $I_d$ can be given by the relations:

$$V_d = V^+ - V^- \qquad \text{Equation 11}$$

$$I_d = I^+ - I^- \qquad \text{Equation 12}$$

$$I_d = \alpha_F I_{SS} \tanh\left(\frac{V_d}{2V_T}\right) \qquad \text{Equation 13}$$

In Equation 13, $\alpha_F$ is the common base current gain. It is defined as the ratio between the emitter to collector currents in the forward active region of the BJT device. It is given as:

$$\alpha_F = \frac{I_C}{I_E} \qquad \text{Equation 14}$$

Also in Equation 13, $V_T$ is the thermal voltage and is given as:

$$V_T = \frac{kT}{q} \qquad \text{Equation 15}$$

In Equation 15, k is Boltzmann constant, T is the temperature in degrees Kelvin, and q is the electron charge.

Assume that an AC differential signal of angular frequency ($\omega_x$) and amplitude $A_o$ is applied to the BJT differential pair. Neglecting the high frequency effects, the output differential current of the BJT pair is given by:

$$I_d(t) = \alpha_F I_{SS} \tanh\left(\frac{1}{2}\left(\frac{A_0}{V_T}\right)\sin(\omega_x t)\right) \qquad \text{Equation 16}$$

Comparing this equation to that of the CMOS differential pair, one realizes that the harmonic content of the BJT differential pair 701 and 702 can be stabilized by stabilizing the ratio between the input signal amplitude $A_o$ and the thermal voltage $V_T$. Thus, applying the techniques explained above to the BJT differential pair, the thermal voltage "$V_T$" is equivalent to "$\psi$" and $\alpha$ is just a scaling factor.

In other words, if the active Gm cell of an oscillator is a BJT differential pair, then $V_T$ is the operating point parameter that should be tracked by the oscillation amplitude to stabilize the oscillator harmonic content. An example of such an oscillator is the differential BJT LC oscillator. The harmonic content of a differential BJT LC oscillator can be stabilized by forcing the oscillation amplitude to track the thermal voltage $V_T$.

In another embodiment of the invention, a phi-null oscillator employing the self biasing technique is now described. In such an oscillator, the self biasing technique is used to enhance the stability of its output frequency by stabilizing its harmonic content versus the variation of the different operating conditions, most importantly temperature.

Figure 13:
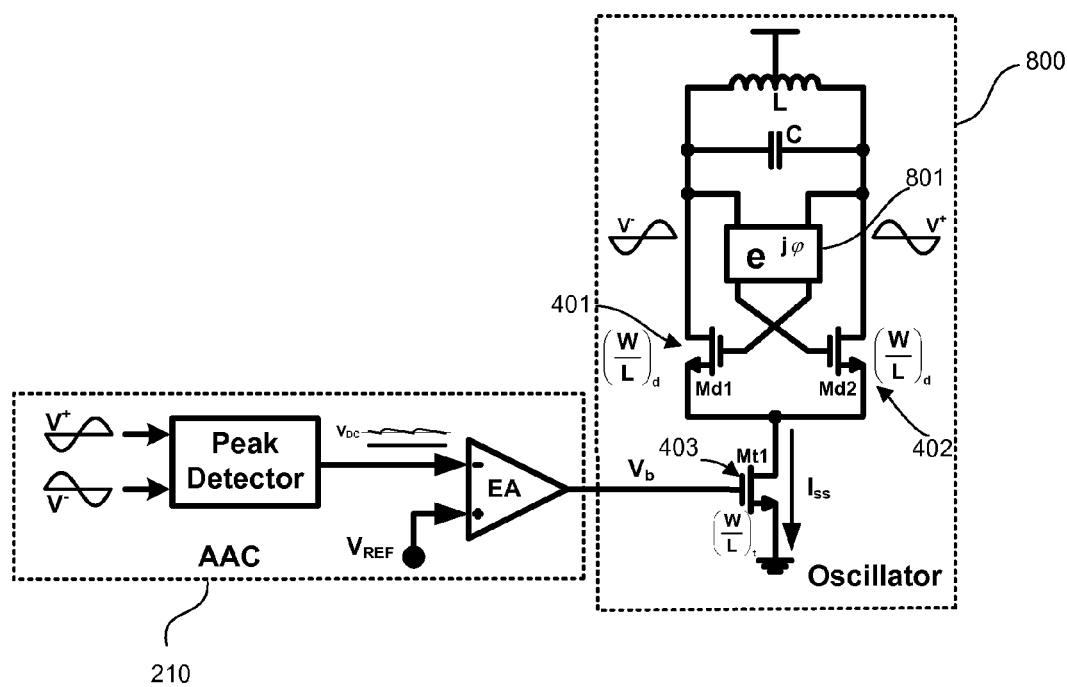
FIG. 13 is a diagram of a phi-null LC oscillator operating at the temperature null phase of the LC tank by utilizing a phase shifter block ($e^{j\Phi}$) and an AAC.

LC tank oscillators operating at the tank temperature-null phase to achieve highly stable output frequency have been described in U.S. Pat. No. 8,072,281, incorporated herein by reference. FIG. 13 shows an LC tank oscillator 800 operating at the tank temperature-null phase by inserting a phase shifter 801 that provides a positive phase shift in the feedback loop of the oscillator that is equal to the negative of the LC tank temperature-null phase. The LC tank oscillator 800 is similar to LC tank 400 shown in FIG. 9, for example, except for the phase shift 801. The apparatus comprises an AAC 210 to enable operation at the tank temperature-null phase by minimizing the impact of the active circuitry. In this circuit 210, the reference voltage $V_{REF}$ is constant, giving constant oscillation amplitude. This apparatus, which comprises the LC tank oscillator operating at the tank temperature-null phase and an AAC, may be referred to as a "phi-null oscillator." FIG. 14 shows a self-biased phi-null oscillator, which combines the tracking circuit 500, AAC circuit 210 and self-biasing loop of FIG. 9 with the LC tank oscillator 800 of FIG. 13.

Figure 14:
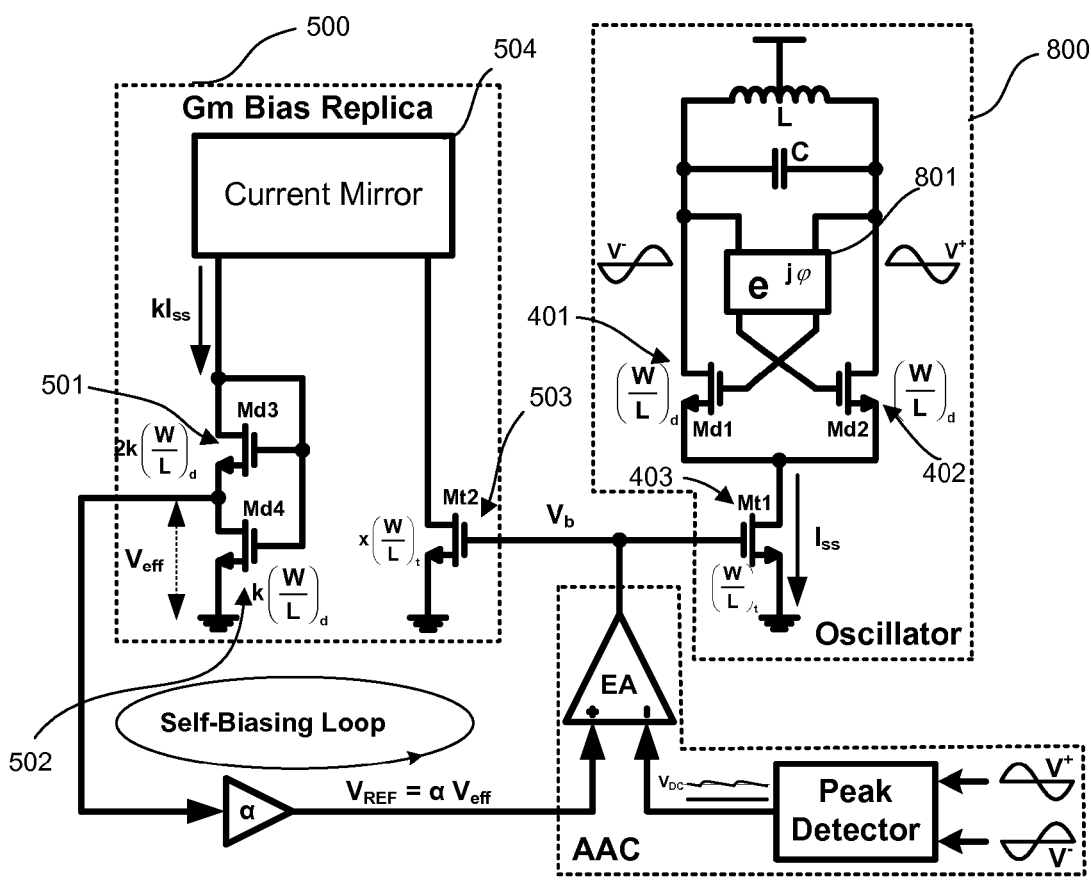
FIG. 14 is a diagram of a phi-null oscillator utilizing the self-biasing technique to enhance its performance.
Figure 15A:
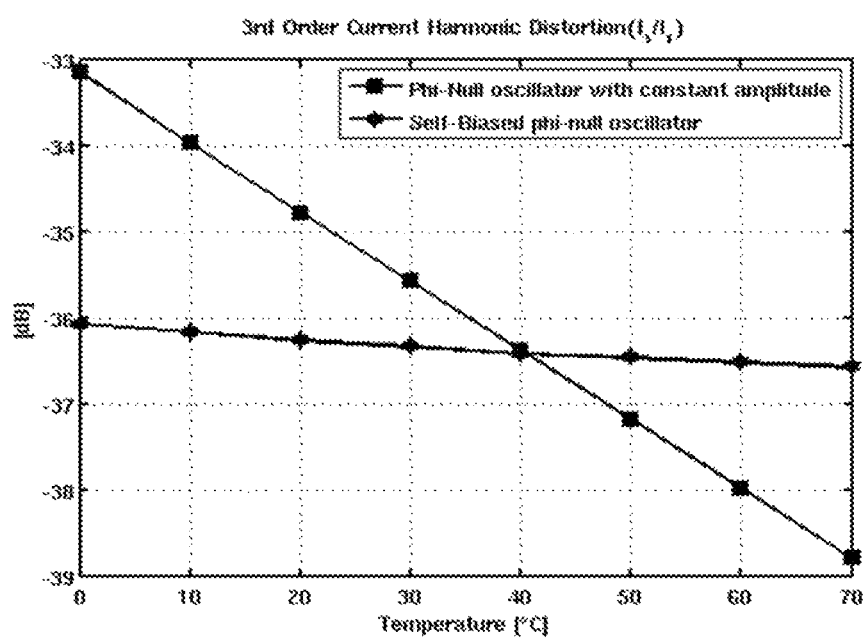
FIG. 15A is a diagram illustrating $3^{rd}$ order current harmonic distortion versus temperature of a phi-null oscillator with and without the self-biasing technique.

The two oscillators: the normal phi-null oscillator shown in FIG. 13 and the self-biased phi-null oscillator shown in FIG. 14 were simulated to test their frequency stability and harmonic content across temperature. FIG. 15A shows the simulated $3^{rd}$ order harmonic distortion versus temperature. The self-biasing technique substantially stabilizes the current harmonic content across temperature with less than 0.5 dB of variation. This has a major impact in enhancing the frequency stability of the self-biased phi-null oscillator over the normal phi-null oscillator as observed from the FIG. 15B.

Figure 15B:
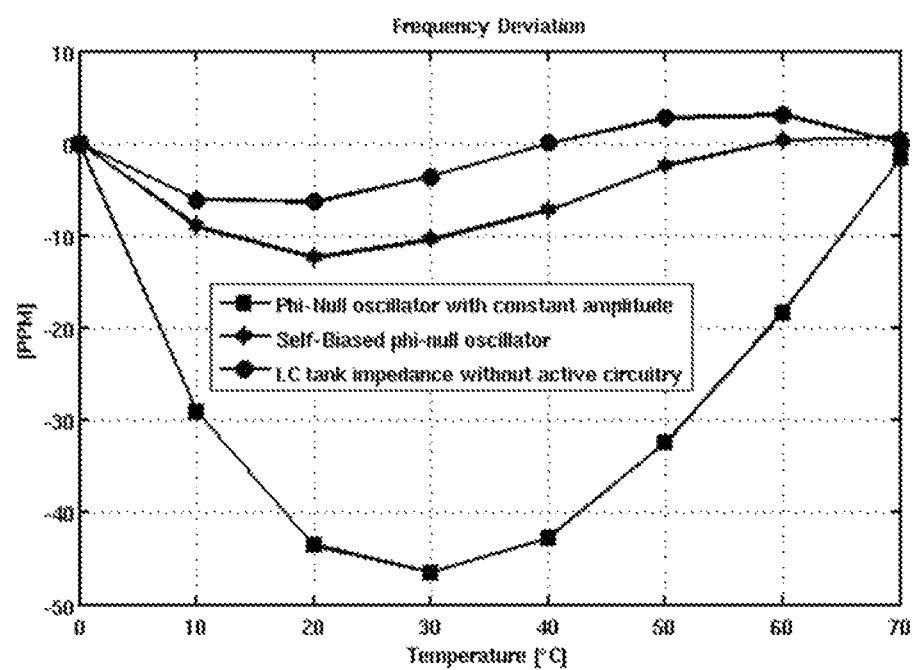
FIG. 15B is a diagram illustrating frequency deviation versus temperature of the phi-null oscillator with and without the self-biasing technique.

FIG. 15B compares the frequency deviation versus temperature of the two oscillators. The frequency is expressed in terms of the deviation from its value at 0° C. in units of part per million, "PPM". First of all, FIG. 15B shows the small signal frequency deviation over temperature due to the variation of the LC tank impedance across temperature at the temperature-null phase of the LC tank. In this case, the peak-to-peak frequency deviation is in the order of a few PPMs. However, the normal phi-null oscillator (FIG. 13) exhibits quite a different behavior from that of the LC tank due to the impact of the active circuitry. It achieves a peak-to-peak frequency deviation in the order of a few tens of PPMs. On the other hand, the self-biased phi-null oscillator (FIG. 14) frequency deviation exhibits almost the same behavior as that of the LC tank impedance, which means that the techniques described herein almost eliminated the impact of the active circuitry on the LC tank behavior.

It will be apparent to those skilled in the part that the present invention can be embodied in different forms without departing from the spirit or essential character thereof. The disclosed embodiments are therefore intended in all respects to be illustrative and not restrictive. The scope of the invention is defined by the appended claims, not the foregoing description, and all changes which come within the range of equivalents thereof are intended to be embraced therein.

What is claimed is:

1. A method of reducing or minimizing variations in harmonic content of current applied to a resonator of an oscillator circuit comprising an amplifier and a resonator coupled in a closed loop, the method comprising:

producing a bias signal for the amplifier by performing automatic amplitude control of the output signal using a time-varying amplitude reference signal; and deriving the time-varying amplitude reference signal from the bias signal using a replica circuit that replicates at least one property of the amplifier circuit.

2. The method of claim 1, wherein the time-varying amplitude reference signal is derived so as to reduce or minimize variations in harmonic content of a current applied to the resonator.

3. The method of claim 2, wherein stability over operating conditions of an output frequency of an output signal of the oscillator circuit is enhanced by reducing or minimizing variations in harmonic content of current applied to the resonator.

4. The method of claim 1, wherein the oscillator circuit is an LC oscillator circuit, comprising operating the LC oscillator circuit within a region of a local or global temperature null, in which region sensitivity of the frequency of the output signal to changes in temperature is minimized.

5. The method of claim 4, comprising forcing there to appear across the resonator an impedance angle that is substantially different than zero.

6. The method of claim 4, comprising:

shifting the operating condition null to coincide with an impedance across the resonator that is zero or near zero; and forcing there to appear across the resonator an impedance angle that is zero or near zero.

7. The method of claim 1, wherein the amplifier is a differential MOS amplifier and the property of the amplifier is an overdrive voltage by which a gate voltage applied to a MOS transistor of the amplifier exceeds a threshold voltage of that transistor.

8. The method of claim 1, wherein the amplifier is a differential bipolar amplifier and the property of the amplifier is the thermal voltage of a bipolar transistor of the amplifier.

9. A method of operating an LC oscillator circuit comprising an amplifier and a resonator coupled in a closed loop, the method comprising:

operating the LC oscillator circuit within a region of a local or global temperature null, in which region sensitivity of the frequency of the output signal to changes in temperature is minimized;

producing a bias signal for the amplifier by performing automatic amplitude control of the output signal using a time-varying amplitude reference signal; and deriving the time-varying amplitude reference signal from the bias signal using a replica circuit that replicates at least one property of the amplifier circuit.

10. The method of claim 9, comprising forcing there to appear across the resonator an impedance angle that is substantially different than zero.

11. The method of claim 9, comprising:

shifting the operating condition null to coincide with an impedance across the resonator that is zero or near zero; and forcing there to appear across the resonator an impedance angle that is zero or near zero.

12. The method of claim 9, wherein stability over operating conditions of an output frequency of an output signal of the oscillator circuit is enhanced by reducing or minimizing variations in harmonic content of current applied to the resonator.

13. The method of claim 9, wherein the time-varying amplitude reference signal is derived so as to reduce or minimize variations in harmonic content of a current applied to the resonator.

14. The method of claim 9, wherein the amplifier is a differential MOS amplifier and the property is an overdrive voltage by which a gate voltage applied to a MOS transistor of the amplifier exceeds a threshold voltage of that transistor.

15. The method of claim 9, wherein the amplifier is a differential bipolar amplifier and the property is the thermal voltage of a bipolar transistor of the amplifier.

16. A method of enhancing stability over operating conditions an output frequency of an output signal of an oscillator circuit comprising an amplifier and a resonator coupled in a closed loop, the method comprising:
producing a bias signal for the amplifier by performing automatic amplitude control of the output signal using a time-varying amplitude reference signal; and
deriving the time-varying amplitude reference signal from the bias signal using a replica circuit that replicates at least one property of the amplifier circuit.

17. The method of claim 16, wherein the time-varying amplitude reference signal is derived so as to reduce or minimize variations in harmonic content of a current applied to the resonator.

18. The method of claim 16, wherein the oscillator circuit is an LC oscillator circuit, comprising operating the LC oscillator circuit within a region of a local or global temperature null, in which region sensitivity of the frequency of the output signal to changes in temperature is minimized.

19. The method of claim 16, comprising forcing there to appear across the resonator an impedance angle that is substantially different than zero.

20. The method of claim 16, comprising:
shifting the operating condition null to coincide with an impedance across the resonator that is zero or near zero; and
forcing there to appear across the resonator an impedance angle that is zero or near zero.

21. The method of claim 16, wherein the amplifier is a differential MOS amplifier and the property is an overdrive voltage by which a gate voltage applied to a MOS transistor of the amplifier exceeds a threshold voltage of that transistor.

22. The method of claim 16, wherein the amplifier is a differential bipolar amplifier and the property is the thermal voltage of a bipolar transistor of the amplifier.

23. Circuitry comprising:
an oscillator circuit comprising an amplifier and a resonator coupled in a closed loop;
automatic amplitude control circuitry for producing a bias signal for the amplifier by performing automatic amplitude control of an output signal of the amplifier using a time-varying amplitude reference signal; and
replica circuitry that replicates at least one property of the amplifier for deriving the time-varying amplitude reference signal from the bias signal.

24. The apparatus of claim 23, wherein the amplifier is a differential MOS amplifier and the property is an overdrive voltage by which a gate voltage applied to a MOS transistor of the amplifier exceeds a threshold voltage of that transistor.

25. The apparatus of claim 23, wherein the amplifier is a differential bipolar amplifier and the property is the thermal voltage of a bipolar transistor of the amplifier.

26. The apparatus of claim 23, wherein the time-varying amplitude reference signal is derived so as to enhance stability over operating conditions of an output frequency of the output signal of the oscillator circuit.

27. The apparatus of claim 23, wherein the replica circuit is configured to derived the time-varying amplitude reference signal so as to reduce or minimize variations in harmonic content of a current applied to the resonator.

28. Circuitry comprising:
an LC oscillator circuit comprising an amplifier and a resonator coupled in a closed loop;
control circuitry for operating the LC oscillator circuit within a region of a local or global temperature null, in which region the frequency of the output signal exhibits a reduced sensitivity to changes in temperature;
automatic amplitude control circuitry for producing a bias signal for the amplifier by performing automatic amplitude control of an output signal of the amplifier using a time-varying amplitude reference signal; and
replica circuitry that replicates at least one property of the amplifier for deriving the time-varying amplitude reference signal from the bias signal.

29. The apparatus of claim 28, wherein the amplifier is a MOS amplifier and the property is an overdrive voltage by which a gate voltage applied to a MOS transistor of the amplifier exceeds a threshold voltage of that transistor.

30. The apparatus of claim 28, wherein the amplifier is a bipolar amplifier and the property is the thermal voltage of a bipolar transistor of the amplifier.

31. The apparatus of claim 28, wherein the time-varying amplitude reference signal is derived so as to enhance stability over operating conditions of an output frequency of the output signal of the oscillator circuit.

32. The apparatus of claim 28, wherein the replica circuit is configured to derived the time-varying amplitude reference signal so as to reduce or minimize variations in harmonic content of a current applied to the resonator.

33. The apparatus of claim 28, wherein the control circuit is configured to force there to appear across the resonator an impedance angle that is substantially different than zero.

34. The apparatus of claim 28, wherein the control circuit is configured to shift the operating condition null to coincide with an impedance across the resonator that is zero or near zero, and to force there to appear across the resonator an impedance angle that is zero or near zero.

* * * * *